(12) United States Patent
Bieri et al.

(10) Patent No.: US 8,497,680 B2
(45) Date of Patent: Jul. 30, 2013

(54) MAGNETIC RESONANCE METHOD FOR QUANTIFICATION OF MOLECULAR DIFFUSION USING DOUBLE ECHO STEADY STATE SEQUENCES

(75) Inventors: Oliver Bieri, Liestal (CH); Klaus Scheffler, Basel (CH)

(73) Assignee: University Hospital of Basel, Basel (CH)

( * ) Notice: Subject to any disclaimer, the term of this patent is extended or adjusted under 35 U.S.C. 154(b) by 298 days.

(21) Appl. No.: 13/070,814

(22) Filed: Mar. 24, 2011

(65) Prior Publication Data

US 2012/0242334 A1 Sep. 27, 2012

(51) Int. Cl.
*G01V 3/00* (2006.01)

(52) U.S. Cl.
USPC .......................................... 324/309; 324/307

(58) Field of Classification Search
USPC ........................... 324/300–322; 600/407–445
See application file for complete search history.

(56) References Cited

U.S. PATENT DOCUMENTS

| | | | |
|---|---|---|---|
| 6,891,373 B2 | 5/2005 | Deimling | |
| 7,804,299 B2 * | 9/2010 | Reeder et al. | 324/309 |
| 8,076,936 B2 * | 12/2011 | Borthakur et al. | 324/307 |
| 2009/0299172 A1 * | 12/2009 | Corot et al. | 600/420 |

OTHER PUBLICATIONS

Cho et al., "NMR diffusion coefficient mapping by use of fast steady-state free precession sequence," in Proc. Society of Magnetic Resonance in Medicine, vol. 34, 1989, pp. 911.
Freed et al., "Steady-state free precession experiments and exact treatment of diffusion in a uniform gradient," in J. Chem. Phys., vol. 115(9), 2001, pp. 4249-4258.
Kaiser et al., "Diffusion and field-gradient effects in NMR Fourier spectroscopy," J. Chem. Phys., vol. 60(8), Apr. 15, 1974, pp. 2966-2979.

* cited by examiner

*Primary Examiner* — Brij Shrivastav
(74) *Attorney, Agent, or Firm* — Joyce von Natzmer; Agris & von Natzmer LLP

(57) ABSTRACT

Disclosed is a magnetic resonance method for the quantification of molecular diffusion. The method uses a diffusion-weighted (dw) double echo steady state sequence (DESS). In particular, the method allows direct quantification of molecular diffusion from two steady state scans with differing diffusion weighting such as one with diffusion-weighting and preferably one without diffusion weighting. Such a quantification of molecular diffusion allows for rapid and/or quantitative measurements of physiological and/or functional parameters of living tissue. Quantitative measurements are often a prerequisite for pre-clinical and clinical research as well as for clinical trials in drug research performed at different sites. Especially for the early diagnosis of subtle or diffuse pathological changes, quantitative MR promises to have a very significant impact.

18 Claims, 3 Drawing Sheets

MAGNETIC RESONANCE METHOD FOR QUANTIFICATION OF MOLECULAR DIFFUSION USING DOUBLE ECHO STEADY STATE SEQUENCES

FIELD OF THE INVENTION

The present invention is directed at a method and apparatus for magnetic resonance imaging (MRI), which is based on the measurement of molecular diffusion. The method allows for rapid and/or quantitative measurements of physiological and/or functional parameters in different living tissues.

BACKGROUND OF THE INVENTION

Since its introduction in 1977 as an alternative (or as supplementation) to invasive surgical procedures and/or x-rays, the utilization of MRI in medical diagnosis and treatment has increased dramatically. In this regard, modem MRI techniques produce images with exceptional contrast and which can be rendered in any plane as well as three-dimensionally. Moreover, apart from their imaging quality, MRI techniques are believed to be very safe. For example, MRI techniques do not utilize harmful ionizing radiation but instead rely on the application of magnetic fields and radio frequencies which induce atomic level energy changes which are detectable for assimilation into highly detailed, accurate body (or other object type) images. In contrast, imaging techniques such as computerized tomography scanning (CT scanning) expose patients to significant doses of ionizing radiation which is believed to increase incidences of malignancy. Furthermore, CT techniques cannot reproduce the relative high contrast of an MRI image and have the additional shortcoming of not being able to adequately differentiate between similar but otherwise distinct tissue types (e.g., in particular, if the tissues have similar densities).

The publications and other materials, including patents, used herein to illustrate the invention and, in particular, to provide additional details respecting the practice are incorporated herein by reference. For convenience, the publications are referenced in the following text by author and date and are listed alphabetically by author in the appended bibliography.

The magnetic resonance (MR) signal can be made sensitive to dynamic displacements ("diffusion") of water at a cellular level and therefore offers a unique insight into tissue structure and organization. Diffusing water molecules typically move approximately 20 µm in 100 ms or 60 µm in 1 s. The collective diffusion movement of the water molecules becomes noticeable as a weakening of the magnetic resonance signal.

Although diffusion measurements were already described in the mid sixties by Stejskal and Tanner, it took almost 30 years for diffusion weighted imaging (DWI) to enter clinical practice (Schaefer et al, 2000). Since then, DWI has proven to be a highly sensitive and specific parameter to detect physiological and patho-physiological changes for many intracranial disease processes (Schaefer et al, 2000), cancer (Charles-Edwards et al, 2006) and for whole body tumor detection (Kwee et al., 2008; Koh et al., 2007). Single-shot echo planar imaging (EPI) techniques are generally considered particularly suitable for DWI since EPI sequences are frequently used for neuroimaging or for mapping microstructural properties of the brain using diffusion tensor imaging (DTI). EPI sequences are highly insensitive to bulk motion and are probably the fastest imaging sequences available, but suffer from spatial distortions caused by magnetic field inhomogeneities that may need retrospective correction. A more severe drawback, however, is that with EPI's only rather poor spatial resolution can be achieved and poor coverage for species/samples with short $T_2$. Thus, especially for high resolution imaging of targets with high susceptibility variation, such as the musculoskeletal system (MSK), EPI may not be the method of choice and several other three-dimensional (3D) DWI sequences have been proposed, some of them using the diffusion sensitivity of non-balanced steady-state free precession (SSFP) type of sequences (Miller et al., 2004; Deoni et al, 2004; Mamisch et al, 2008; Welsch et al, 2009; Friedrich et al., 2010). Especially the "Echo" in non-balanced SSFP type sequences (i.e., the refocused signal immediately preceding the RF pulse) is very sensitive to diffusion and represents a unique alternative to standard EPI-based DWI, whereas the "FID" signal ("free-induction decay" signal, i.e., the signal immediately following the radio frequency (RF) pulse) is generally not used, since its sensitivity to diffusion is quite low.

Several models have been developed for the description of diffusion effects in SSFP sequences (Kaiser et al., 1974; Patz et al, 1986; LeBihan et al., 1988; Merboldt et al, 1989; Wu and Buxton, 1990; Buxton, 1993), all of them being based on the seminal work of Kaiser, Bartholdi and Ernst (KBE) (Kaiser et al., 1974). In MRI, besides semi-empirical approaches, such as the one presented by LeBihan (LeBihan et al., 1988), the extension of the so called "KBE ansatz" to pulsed gradient SSFP by Wu and Buxton for MRI pulse sequences (Wu and Buxton, 1990; Buxton, 1993) is generally well accepted and several research groups have examined the effect of an unipolar diffusion sensitizing gradient with SSFP-Echo type of sequences (see FIG. 1a) (Miller et al., 2004; Deoni et al, 2004; Mamisch et al, 2008; Welsch et al, 2009; Friedrich et al., 2010; Patz et al, 1986, Merboldt et al, 1989). Nevertheless, quantification of diffusion effects with SSFP-Echo has not yet found great approval in MRI, since diffusion effects strongly depend on relaxation times ($T_1$, $T_2$). However, it has been shown that diffusion effects are to a leading order independent from $T_2$ for repetition times TR ~1.5 $T_2$ (Buxton, 1993). As a result, diffusion quantification with SSFP-Echo was shown to be feasible in-vivo, provided $T_1$ is known (Miller et al., 2004). Unfortunately, within this limit, signal to noise ratio (SNR) and scanning efficiency is considerably reduced and far away from what could be considered to be optimal. Nevertheless, the theory of DWI with SSFP-Echo was also extended to anisotropic effects (McNab et al, 2009), allowing to probe for the structure of white matter tracts in the human brain with compelling results.

Another approach to diffusion quantification with SSFP was proposed by Deimling based on a double-echo SSFP (DESS) technique (U.S. Pat. No. 6,891,373, which is incorporated herein by reference in its entirety). Within Deimling's approach, sensitivity to diffusion is achieved via a bipolar gradient waveform, as commonly used with gradient-echo sequences (see FIG. 1b). Deimling proposes to use bipolar gradients noting that unipolar diffusion sensitizing gradients previously lead to complexities in the phase history. In particular, the phase history experienced an expansion via an applied unipolar diffusion gradient so that an assessment of the diffusion coefficient (which thereby depends on the phase history and thus on $T_1$ and $T_2$) is no longer possible. Deimling resolves this problem by using bipolar diffusion sensitizing gradients which offered a simpler diffusion weighting since the expansion caused by the diffusion gradients was compensated by the phase curves. The use of bipolar diffusion sensitizing gradients also led Demling to well-defined diffusion times and allowed him to compensate for the residual $T_2$ weighting by using a combined measurement of the FISP and PSIF signal. In particular, Deimling proposed to use both echoes, namely the free induction decay (FID) (in the following referred to as the $S^+$ signal) and the Echo (the time-reversed FID, in the following referred to as $S^-$ signal) within any TR since the signal attenuation from diffusion depends for the echo ratio $S^-/S^+$ only on the bipolar gradient waveform (i.e., there is no dependence on relaxation times) and therefore allows a direct assessment of the diffusion constant (D) (Chu, 1989). Demling's diffusion constant (D) is a function of the b-value, which is given by the amplitude ($G_0$) and pulse width ($\delta$) of his bipolar diffusion gradient. However, Demling's method suffers from the rather low sensitivity of the bipolar gradient waveforms to diffusion, generally requiring large moments, therefore long repetition times and thus long scan times.

The use of short repetition times (TR<<$T_2$) with diffusion weighted (dw) SSFP-Echo (FIG. 1a) has shown good promise for the characterization of cartilage function and repair (7): Using a simple semi-quantitative measure, i.e. by taking the ratio of a diffusion and a non-diffusion weighted SSFP-Echo acquisition, in-vivo high-resolution DWI of cartilage was shown to complement the information of $T_2$-mapping or dGEMRIC. As compared to other "true" quantitative mapping techniques, such as $T_2$, $T_{1rho}$, and dGEMRIC, however, some ambiguity of the semi-quantitative DWI approach with SSFP arises in the interpretation of results due to the confounding influence of longitudinal and transverse relaxation.

Diffusion sensitized ("weighted") SSFP-Echo has shown great promise and compelling results were demonstrated with a signal to noise ratio (SNR) and contrast to noise ratio (CNR) efficiency that outperforms other 3D diffusion weighted spin echo (SE) techniques. Nevertheless there is much room for optimization and further development: Generally, non-balanced SSFP is prone to motion and for successful in-vivo quantification of diffusion effects, frequently, navigator-based correction methods are applied (Miller et al., 2004). Furthermore, for state-of-the-art SSFP-Echo based DWI, repetition times at least similar to $T_2$ must be chosen in order to allow for quantification (provided $T_1$ is known) and the accuracy of quantification increases with increasing flip angles. Typically, however, a short TR<<$T_2$ is much more desirable since this not only reduces sensitivity to bulk motion but also increases SNR, reduces scan times, and thus allows scans with increased resolution.

Thus, there remains of a need for fast quantitative SSFP-based DWI with short TRs. In particular for targets of high susceptibility variation, there is a need for high-resolution quantitative diffusion MRI sequences with short and thus clinically practicable scan times.

More in particular, from the above, it is apparent that there exists a need in the art for imaging methods and/or apparatus which solve or at least ameliorate one or more of the above drawbacks of the prior art. It is a purpose of this invention to fulfill these needs as well as other needs which will become more apparent to the skilled artisan once given the following disclosure.

SUMMARY OF THE INVENTION

Figure 1:
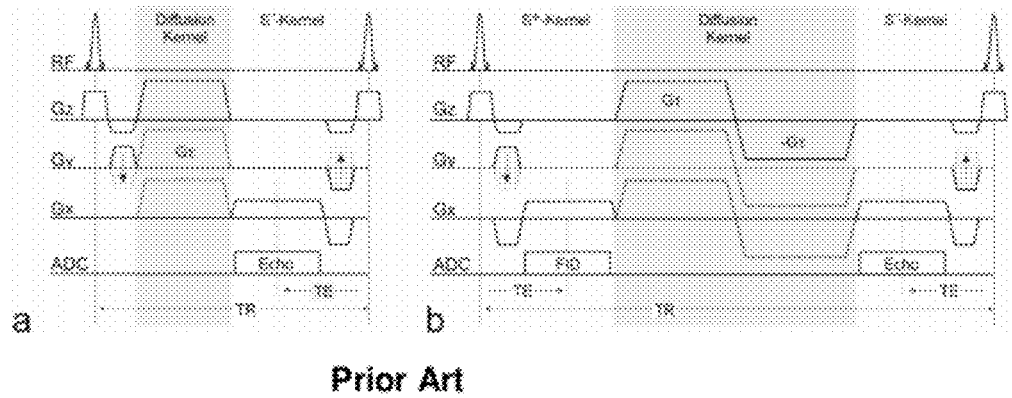
FIG. 1 shows prior art diffusion-weighted (dw) SSFP sequences. In (a) a diffusion-weighted SSFP-Echo sequence is shown, in (b) a diffusion-weighted double echo SSFP sequence using bipolar diffusion sensitizing gradients is depicted. In (a) sensitivity to diffusion is a result of the unipolar diffusion sensitizing gradient (with dephasing moment $G\tau$) whereas in (b) a bipolar diffusion sensitizing gradient directly affects (reduces) the steady-state amplitude within any repetition time (TR) (here, spin dephasing is not increased).

The present invention is directed at a method and apparatus for magnetic resonance imaging (MRI), which is based on the measurement of molecular diffusion.

The present invention is, in one embodiment, directed at a method of MRI in which a first and second set of magnetic resonance SSFP-FID and SSFP-Echo images are acquired, wherein an unipolar diffusion sensitizing pulse sensitizes the first and/or second set of SSFP-FID and SSFP-Echo images. However, the unipolar sensitizing moments of the first and/or second set of SSFP-FID and SSFP-Echo images differ. For example, the first set may have a low or no diffusion sensitizing moment and the second set may have a higher diffusion sensitizing moment than the first set. The images of the first set of images may be combined to obtain one or more first double echo SSFP (DESS) images. The images of the second set of images may also be combined to obtain one or more second double echo SSFP (DESS) images. Generally the diffusion contrast of the first and second DESS image(s) differ, e.g., the second image might have a higher diffusion contrast than the first. The first double echo SSFP (DESS) image(s) is/are combined with the second double echo SSFP (DESS) image(s) to obtain a diffusion weighted image that is independent of the relaxation time, i.e. is "truly" diffusion weighted. Preferably, the molecular diffusion constant (D) is assessed from this diffusion weighted image that is independent of the relaxation time.

The invention is also directed at a method for diffusion-weighted MR imaging (DWI), comprising:

performing a first double echo SSFP (DESS) scan of a sample, wherein a first set of SSFP-FID ($S_1^+$) and SSFP-Echo ($S_1^-$) image data of said sample is acquired from at least one first $S^+$ signal and at least one first $S^-$ signal and wherein said first set of image data has a gradient dephasing moment of $|G\tau_1|$, performing a second double echo SSFP (DESS) scan of said sample, wherein a second set of SSFP-FID ($S_2^+$) and SSFP-Echo ($S_2^-$) image data of said sample is acquired from at least one second $S^+$ signal and at least one second $S^-$ signal and wherein said second set of image data has a gradient dephasing moment of $|G\tau_2|$, wherein $|G\tau_1| \neq |G\tau_2|$, wherein at least said second set of image data is diffusion-sensitized via an unipolar diffusion sensitizing gradient pulse placed between said at least one second $S^+$ signal and at least one second $S^-$ signal, combining the first set of image data with the second set of image data to obtain a diffusion-weighted MR image which is insensitive to longitudinal and/or transverse relaxation times ($T_1$ and/or $T_2$).

The first set of image data may be diffusion-sensitized via an unipolar diffusion sensitizing gradient pulse placed between said at least one first $S^+$ signal and at least one first $S^-$ signal.

$|G\tau_1|$ may equal 0; $|G\tau_2|$ may be larger than $|G\tau_1|$; $G\tau_1$ and/or $G\tau_2$ may be positive, zero or negative.

The diffusion-weighted MR image may only be sensitive to imaging data parameters, which include, but are not limited to, the gradient dephasing moment $G\tau$, flip angle $\alpha$ and/or repetition time TR.

The diffusion-weighted MR image may be insensitive to $T_1$ and $T_2$ at a flip angle ($\alpha$) for the first and/or second DESS scan below 30°, more preferably 20° degrees.

A flip angle $\alpha$ of the first and/or second DESS scan may be less than 50 degrees, preferably less than 40 degrees, less than 30 degrees, less than 20 or less than 15 degrees.

The combined acquisition time for the first and second scan may be less than 10 minutes, preferably less than 9, 8, 7, 6, 5 minutes.

The sample may comprise cartilage, spinal cord, muscle tissue, liver tissue, brain tissue or nerve tissue.

The second set of image data may be diffusion-sensitized via a singular unipolar diffusion sensitizing gradient pulse between each of the at least one second $S^+$ signal and at least one second $S^-$ signal during a double echo SSPF (DESS) scan of a sample.

The repetition time (TR) of the first and/or second double echo scan may be less than the transverse relaxation time ($T_2$) of the sample, and/or less than 200 ms, less than 150 ms, less than 100 ms, less than 90, 80, 70, 60, 50, 40, 30, 20 ms, preferably between 5 and 50 ms, even more preferably between 10 and 40, 10 and 30 or 10 and 20 ms.

The dephasing moment may be between 80 (mT/m)ms to 150 (mT/m)ms, preferably between 90 (mT/m) ms to 110 (mT/m) ms, more preferably about 100(mT/m) ms, having an amplitude of between 20 mT/m and 30 mT/m, preferably about 25 mT/m.

The signal attenuation of said first and second scan of the $S^+$ signal and the $S^-$ signal from diffusion may, in certain embodiments, be determined according to the following formula:

$$\Delta s := 1 - \frac{s^-}{s^+} = 1 - \frac{S_2^- \cdot S_1^+}{S_1^- \cdot S_2^+} = 1 - \frac{r_{1,2}}{r_{1,1}}$$

wherein
$r_{1,i} := r_1(G\tau_i)$,
$s^+ := S_2^+/S_1^+$, and
$s^- := S_2^-/S_1^-$.

A molecular diffusion constant (D) may be calculated from said diffusion weighted image comprising
parameterizing $\Delta s$ within an interval of D,
wherein $\Delta s = f(D, G\tau_{1,2}, TR, \alpha)$
wherein $G\tau_{1,2}$, TR and $\alpha$ are constants for said first and second scan so that $\Delta s$ is a parameter of the diffusion constant D only, so that $\Delta s = f_{G\tau_{1,2}, TR, \alpha}(D)$,
wherein the diffusion constant D is calculated from inverting said parameterization:

$$D = f_{G\tau_{1,2}, TR, \alpha}^{-1}(\Delta S)$$

The interval of D is preferably between 0 and 2 μm²/ms, 0 and 3 μm²/ms or 0 and 4 μm²/ms.

The above methods may further comprise quantitatively mapping the diffusion constant for said sample to obtain a quantitative diffusion map of said sample.

DETAILED DESCRIPTION OF VARIOUS AND PREFERRED EMBODIMENTS

The invention provides a method for the quantification of molecular diffusion, which preferably combines speed with high resolution and high sensitivity. The method is suitable for the assessment of physiological and/or functional parameters of a wide variety of target samples including, e.g., cartilage and spinal cord as well a muscle, liver, brain and/or nerve tissue some of which have high susceptibility variation. In general the image(s) that provide information about molecular diffusion and/or a molecular diffusion constant can be acquired in scans lasting in total less than 10, 9, 8, 7, 6, 5 or 4 minutes. The molecular diffusion is assessed via a diffusion-weighted double echo SSFP (dwDESS) sequence. Sensitivity to diffusion is achieved via an unipolar diffusion sensitizing gradient that is, preferably, placed between said at least one second FID signal ("free induction decay" signal also referred to herein as SSFP-FID ($S^+$) signal or FISP) and at least one second SSFP Echo (SSFP-Echo ($S^-$) signal (PSIF).

Figure 2:
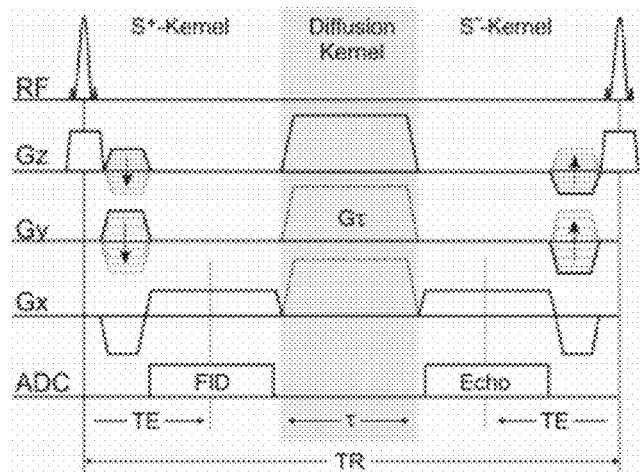
FIG. 2 shows a diffusion-weighted double echo SSFP (dwDESS) sequence scheme according to the invention allowing the generation of truly, i.e., relaxation time independent, diffusion weighted images.

A possible implementation is shown in FIG. 2: Here an unipolar diffusion sensitizing gradient (diffusion sensitizing gradient: "$G\tau$", in millitelsa/meter X millisecond ((mT/m) ms)) of duration T and amplitude G is switched individually in all three spatial directions and is placed in between the image encoding of the SSFP-FID (acquisition of the $S^+$ signal) and the SSFP-Echo (acquisition of the $S^-$ signal), respectively. As the person skilled in the art will appreciate, the amplitude G might be positive or negative and can be switched individually or simultaneously. Within one scan, both SSFP-FID and SSFP-Echo images can be acquired with relatively short repetition time (TR), e.g., TR~10 ms<<$T_2$~50 ms (for tissues). Short repetition times, such as TR~10 ms in combination with low flip angles, such as $\alpha$~20°, as typically used with tissues, provide, in certain embodiments, optimal SNR and maximal diffusion sensitivity even with low dephasing moments, and thus with decreased motion sensitivity.

In preferred embodiments, the dephasing moments are between 80 (mT/m)ms and 150 (mT/m)ms, preferably between 90 (mT/m) ms and 110 (mT/m) ms, more preferably about 100(mT/m) ms. Preferred amplitudes include amplitudes between 20 mT/m and 30 mT/m, preferably about 25 mT/m. $|G\tau_1|$ includes $G\tau_1$ being positive or 0 (generally referred to as $G\tau_1$), but also includes negative $G\tau_1$ values. $|G\tau_2|$ includes $G\tau_2$ being positive or 0 (generally referred to as $G\tau_2$), but also includes negative $G\tau_2$ values.

Depending on the embodiment, repetition times (TRs) are preferably less than the transverse relaxation time ($T_2$) of the sample, in particular less than 200 ms, less than 150 ms, less than 100 ms, less than 90, 80, 70, 60, 50, 40, 30, 20 ms, preferably between 5 and 50 ms, even more preferably between 10 and 40, 10 and 30 or 10 and 20 ms are within the scope of the present invention. Similarly, flip angles of less than 50 degrees, preferably less than 40 degrees, less than 30 degrees, less than 20 or less than 15 degrees are within the scope of the present invention.

The gradient dephasing moment $G\tau$, flip angle $\alpha$ and/or repetition time TR are typical "imaging data parameters", i.e., sequence parameters which can be adjusted by an operator of a MRI apparatus. Those imaging data parameters can be distinguished from intrinsic parameters such as the relaxation times ($T_1$, $T_2$) of the sample, such as cartilage, spinal cord, muscle tissue, liver tissue, brain tissue or nerve tissue, to name a few.

Generally quantification of diffusion effects with SSFP are based on the Wu-Buxton model which is based on the KBE ansatz (8). For the derivation of an analytical solution, Kaiser, Bartholdi and Ernst assumed that the decay rate of positive and negative modes is identical even in the presence of diffusion. However, Freed et al. (2001) showed that this is generally not the case. In fact, considerable differences between the KBE ansatz and experimental results were predicted and observed, especially in the most diffusion sensitizing regime. The discrepancy between diffusion sensitized SSFP-Echo experiments (see FIG. 1a) and theoretical predictions for the low flip angle regime were also observed by Buxton (1993) and Deimling (U.S. Pat. No. 6,891,373), however could, due to the lack of an accurate theoretical description the mismatch, not be resolved. Here, the theoretical description of diffusion effects developed by Freed et al. was followed. Surprisingly, it was found that an assessment of the diffusion coefficient (D) was possible when combining unipolar diffusion sensitizing gradient(s) with the SSFP double-echo (DESS) technique. The use of unipolar diffusion sensitizing gradient(s), at the same time, dramatically reduced the total scan times to less than 15, 10, 9, 8, 7, 6, 5 or 4 minutes.

Mathematical Description of Diffusion Effects in SSFP

The general solution to the Bloch-Torrey equation for unrestricted diffusion in a constant gradient can be written as a Fourier series (17) given by $$M_{xy}(\theta, t) = i \sum_{p=-\infty}^{\infty} b_p e^{i(p+t/TR)\theta} E_{2,p}(t) \quad [1]$$

for the transverse magnetization components and $$M_z(\theta, t) = M_0(1 - e^{-t/T_1}) + \sum_{p=-\infty}^{\infty} z_p e^{ip\theta} E_{1,p}(t) \quad [2]$$

for the longitudinal magnetization component, where $$\theta(\vec{r}) = \gamma(\vec{G} \cdot \vec{r})\tau = \Delta\omega_0(\vec{r})\tau \quad [3]$$

refers to the gradient (G) dependent precession angle (in the rotating frame) during the repetition time TR. In Eq. [1] and Eq. [2], the integer p labels the transverse and longitudinal configuration modes with amplitudes $b_p$ and $z_p$ respectively. The terms $E_{1,p}$ and $E_{2,p}$ describe the attenuation for each mode due to relaxation ($T_{1,2}$) and diffusion (D) between RF pulses, given by $$E_{1,p}(TR) \equiv E_{1,p} = \exp\left\{-TR\left(\frac{1}{T_1} + p^2(\gamma G\tau)^2 D\right)\right\} \quad [4]$$

$$E_{2,p}(TR) \equiv E_{2,p} = \exp\left\{-TR\left(\frac{1}{T_2} + \left[p^2 + p + \frac{1}{3}\right](\gamma G\tau)^2 D\right)\right\} \quad [5]$$

with $\gamma$ being the gyromagnetic ratio.

As presented in any detail by Freed et al. (17), the amplitudes of the lowest modes are given by $$b_0 \equiv S^+ = \frac{-\sin(\alpha)M_0(1 - E_{1,0})}{A_{p=0} - B_{p=0} + r_1 E_{2,-1} C_{p=0}} \quad [6]$$

$$b_{-1} \equiv S^- = -r_1 b_0 \quad [7]$$

The terms $A_p$, $B_p$ and $C_p$ entering Eqs. [6,7] are defined as $$A_p := \frac{1}{2}(E_{1,p} - 1)(1 + \cos\alpha) \quad [8]$$

$$B_p := \frac{1}{2}(E_{1,p} + 1)(1 - \cos\alpha)$$

$$C_p := (E_{1,p} - \cos\alpha) = A_p + B_p$$

and $$r_1 = -\frac{b_{-1}}{b_0} \equiv -\frac{S^-}{S^+} = \frac{1}{E_{2,-1}B_{p=0}} x_1 + \frac{E_{2,0}C_{p=1}}{B_{p=1}} \quad [9]$$

is derived from a continued fraction expansion, with $$x_1 = \cfrac{n_1}{d_1 + \cfrac{n_2}{d_2 + \cfrac{n_3}{d_3 + \cdots \cfrac{n_l}{d_l + e_l}}}} \quad [10]$$

where the numerator, $n_p$, is given by $$n_p = -E_{2,-p} E_{2,p-1} A_p^2 B_{p-1}/B_p \quad [11]$$

the denominator, $d_p$, is given by $$d_p = (A_p - B_p) + E_{2,-p-1} E_{2,p} B_p C_{p+1}/B_{p+1} \quad [12]$$

and the extra term, $e_p$, is given by $$e_p = -E_{2,p} E_{2,-p-1} B_p C_{p+1}/B_{p+1} \quad [13]$$

The continued fraction converges very quickly. It is found that truncation at l=5 or 6 results in $S^+$ and $S^-$ mode amplitudes that are accurate to several decimal places.

Diffusion Quantification

In the following examples, $|G\tau_1|=0$ (G=0) and $|G\tau_2|$ is dephased via a unipolar diffusion gradient pulse and is greater than 0 (G>0).

Diffusion related signal reduction in SSFP-FID (S$^+$) and SSFP-Echo (S$^-$) is given by $$s^{\pm} := \frac{S_2^{\pm}}{S_1^{\pm}} \quad [14]$$

wherein, e.g., $S_2^{\pm} \equiv S^{\pm}(G\tau_2 > 0)$ and $S_1^{\pm} \equiv S^{\pm}(G\tau_1 = 0)$ or diffusion quantification, at least two dwDESS scans need to be performed: one with and one without additional dephasing moments. Diffusion effects for dwDESS are analyzed based on the signal attenuation (echo ratio)

$$\Delta s := 1 - \frac{s^-}{s^+} = 1 - \frac{S_2^- \cdot S_1^+}{S_1^- \cdot S_2^+} = 1 - \frac{r_{1,2}}{r_{1,1}} \quad [15]$$

$r_{1,i} := r_1(G\tau_i)$ as proposed by Chu et al. (1989) and Deimling (U.S. Pat. No. 6,891,373).

Figure 3:
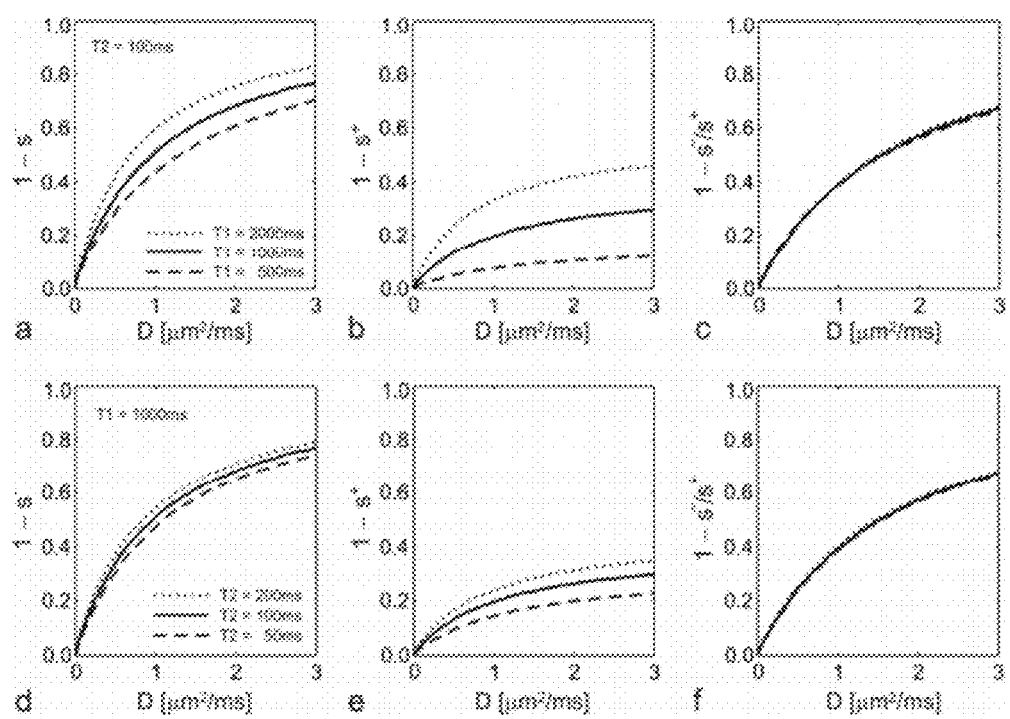
FIG. 3: Signal attenuation of the $S^+$, the $S^-$ and the echo ratio $S^-/S^-$ as a function of molecular diffusion D for (a, b, c) varying longitudinal relaxation times ($T_1$=500, 1000, 2000 ms) but constant transverse relaxation times (T2=100 ms) and for (d, e, f) varying transverse relaxation times ($T_2$=50, 100, 200 ms) but constant longitudinal relaxation times ($T_1$=1000 ms). Generally, $S^+$ (b, e) shows a much lower sensitivity to diffusion than $S^-$ (a, d), but both echoes show a prominent sensitivity on relaxation times, as expected. This dependency on relaxation times, however, is completely removed in the $S^+/S^-$ (c, f) echo ratio. (Simulation parameters: TR=15 ms, $\alpha$=15° and $G\tau$=(200 mT/m) ms).

A simulation of the dependence of diffusion effects on relaxation times is shown for the S$^+$ and S$^-$ signal in FIG. 3. The Figure depicts the signal attenuation of the S$^+$, the S$^-$ and the echo ratio S$^+$/S$^-$ as a function of molecular diffusion D for (a, b, c) varying longitudinal relaxation times (T$_1$=500, 1000, 2000 ms) but constant transverse relaxation times (T2=100 ms) and for (d, e, f) varying transverse relaxation times (T$_2$=50, 100, 200 ms) but constant longitudinal relaxation times (T$_1$=1000 ms). Generally, S$^+$ (b, e) shows a much lower sensitivity to diffusion than S$^-$ (a, d), but both echoes show a prominent sensitivity on relaxation times, as expected. This dependency on relaxation times, however, is completely removed in the S$^+$/S$^-$ (c, f) echo ratio.

Strong signal attenuation is observed for the SSFP-Echo path (FIG. 3a,d), whereas the SSFP-FID path shows a much lower sensitivity to diffusion (FIG. 3b,e), as expected. In general, dispersion in T$_1$ and T$_2$ leads to a considerable variation of diffusion effects in both echoes, reflecting the sensitivity of all echo paths on relaxation properties. Interestingly, variation of diffusion effects is almost perfectly counterbalanced by the echo combination S$^-$/S$^+$ (see FIG. 3c,f) as suggested for the evaluation of diffusion effects from bipolar gradient waveforms. From this, double echo steady state (DESS) signal combination allows for the elimination of confounding T$_1$ and T$_2$ effects and thus offers the possibility to generate truly diffusion weighted images. Diffusion effects, as observed by the echo ratio S$^-$/S$^+$ (see Eq. [15]) are thus only a function of the repetition time TR, the flip angle α and the dephasing moment (Gτ).

Although not shown in any detail in FIG. 3, the loss of T$_1$ and T$_2$ sensitivity with true (i.e. diffusion insensitive) dwSSFP is valid over the whole range of flip angles. It should be noteworthy as well that diffusion effects for the suggested echo combination (Eq. [15]) become independent on T$_1$ and T$_2$ only using the proper signal description offered by Freed et al. Thus, using the proper diffusion model and a particular combination of echo paths, true dwSSFP imaging is insensitive to relaxation, providing an exceptional and exciting new approach for DWI using SSFP-based techniques. Furthermore, from non-diffusion weighted SSFP-FID and SSFP-Echo, a regular DESS image can be produced which was shown to deliver best qualitative and quantitative image quality for isotropic three-dimensional (3D) cartilage-imaging magnetic resonance (MR)-sequences at 3 T (Friedrich et al, 2010). High-resolution (0.4×0.4×3.0 mm) sample images of human patellar cartilage at 3.0 T are displayed in FIG. 4.

Figure 4:
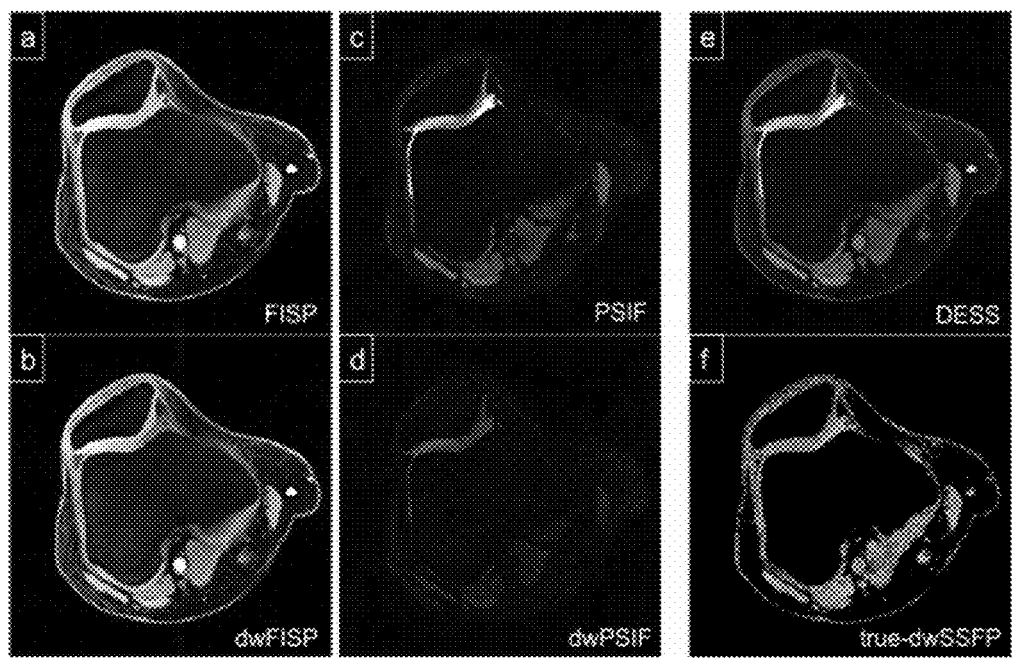
FIG. 4 shows true dwDESS imaging of human patellar cartilage (0.4 mm×0.4 mm×3 mm) at 3 T (Telsa) using the sequence displayed in FIG. 2. (a, c) SSFP-FID and SSFP-Echo image with $G\tau$=0 (mT/m) ms. (b,d) SSFP-FID and SSFP-Echo image with $G\tau$=150 (mT/m) ms. The same windowing was used for images (4a-4d). (e) Non-weighted DESS image, calculated from (a, c). (f) A true dwDESS image is calculated from images (a-d) according to Eq. [15], reflecting only the signal loss from diffusion. (Imaging parameters were: TR=18 ms, TE=4.7 ms, $\alpha$=15°, FOV=140 mm×140 mm with 320×320 base matrix, bandwidth 256 Hz/Pixel, 5 averages and WE pulses were used in combination with iPAT 2, no partial Fourier). The overall acquisition time was 5 min 45 sec including both the non-diffusion and the diffusion-weighted scans ($G\tau$=(150 mT/m)ms).

Two double echo SSFP (DESS) scans with different unipolar gradient dephasing moment (Gτ=0 and 150(mT/m)ms, respectively) resulted in four non-balanced SSFP images (FIG. 4a-FIG. 4d): FIG. 4 shows sample images for true diffusion weighted SSFP imaging of human patellar cartilage (0.4 mm×0.4 mm×3 mm) at 3 T using the sequence displayed in FIG. 2. (a,c) Gτ=0 (mT/m)ms. (b,d) Gτ=150 (mT/m)ms. (e) DESS image, calculated from (a,c). (f) True diffusion weighted SSFP scan reflecting the signal loss from diffusion calculated from images (a-d) according to Eq. [15]. Images (a-d) had, as preferred in the context of many embodiments of the present invention, the same windowing. Other sequence parameters were: TR=18 ms, Echo time, i.e., the time between RF pulse and SSFP-FID or SSFP-Echo signal, TE=4.7 ms, α=15°, FOV=140 mm×140 mm (320×320 base matrix), bandwidth 256 Hz/Pixel, 5 averages and WE pulses were used in combination with iPAT 2 (no partial Fourier). The overall acquisition time was 5 min 45 sec including non-diffusion and diffusion-weighted scans (Gτ=150 (mT/m)ms). Two SSFP-FID (FIG. 4a and FIG. 4b) and two SSFP-Echo (FIG. 4c and FIG. 4d) images with and without diffusion weighting, respectively, are shown. A regular double-echo SSFP (DESS) image (FIG. 4e) can be calculated from the two non-dw SSFP images (FIG. 4a and FIG. 4c), whereas a truly diffusion weighted image (true dwSSFP, see FIG. 4f), i.e. without confounding T1 and T2 weighting (see FIG. 3) can be calculated from the two SSFP-FID (FIG. 4a and FIG. 4b) and two SSFP-Echo (FIG. 4c and FIG. 4d) images according to Eq. [15].

Figure 5:
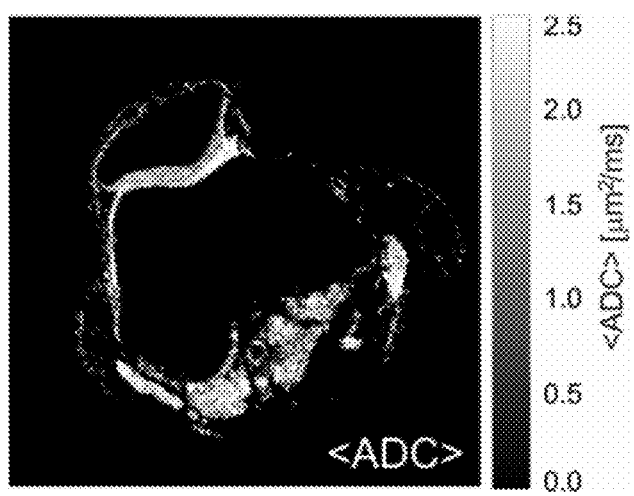
FIG. 5 shows a quantitative diffusion map of the human patellar cartilage (0.3 mm×0.3 mm×3 mm) calculated from true dwDESS image (see FIG. 4f) at 3 T. For the patellar cartilage an apparent diffusion constant of D~1.68 $\mu m^2/ms$ was found.

The true-dwSSFP scan, as given in FIG. 4f, and calculated from Eq. [15] depends only on the imaging sequence parameters, such as the flip angle α, the repetition time TR, the diffusion sensitizing dephasing moment Gτ and the molecular diffusion constant D. As a result, the molecular diffusion constant D can be calculated from Eq. [15], for any given set of sequence parameters {α, TR, Gτ}. For quantification of the diffusion constant D from the observed signal attenuation Δs, Eq. [15] is expanded for any given set of {α, TR, Gτ} in a power series of form $$\log(\Delta s) = \log\left(1 - \frac{S_2^- \cdot S_1^+}{S_1^- \cdot S_2^+}\right) := \alpha_0 + \alpha_1 d + \alpha_2 d^2 + \cdots \quad [16]$$

where d:=log(D). Typically, within the physical range of D=0 . . . 3 μm$^2$/ms, a second order polynomial is accurate enough, yielding, $$D = \exp\left(\frac{-a_1 + \sqrt{a_1^2 - 4a_2(a_0 - \log \Delta s)}}{2a_2}\right) \quad [17]$$

from the parameterization as given in Eq. [16]. The corresponding diffusion map, derived from the true-dwSSFP image as shown in FIG. 4f, using a second order polynomial parameterization of Eq. [15] (see Eq. [16]) and calculation of D according to Eq. [17], is shown in FIG. 5, which shows a quantitative diffusion map of the human patellar cartilage (0.3 mm×0.3 mm×3 mm) calculated from true-dwSSFP image (see FIG. 4f) at 3 T. Here, for patellar cartilage an apparent diffusion constant of D ~1.6 μm$^2$/ms was determined.

Once given the above disclosure, many other features, modifications, and improvements will become apparent to the person skilled in the art. Such other features, modifications, and improvements are therefore considered to be part of this invention, the scope of which is to be determined by the following claims.

BIBLIOGRAPHY

Buxton R. The diffusion sensitivity of fast steady-state free precession imaging Magn Reson Med 1993; 29:235-243.

Charles-Edwards E M, deSouza N M. Diffusion-weighted magnetic resonance imaging and its application to cancer. Cancer Imaging. 2006 Sep. 13; 6:135-43.

Chu M H and Chu Z H. NMR diffusion coefficient mapping by use of fast steady-state free precession sequence. Proc. Society of Magnetic Resonance in Medicine 1989; 34:911.

Deimling M. Method to determine the ADC coefficients in diffusion-weighted magnetic resonance imaging given use of steady-state sequences. United States patent 2005. U.S. Pat. No. 6,891,373.

Deoni, S. C., T. M. Peters, and B. K. Rutt, Quantitative diffusion imaging with steady-state free precession. Magn Reson Med, 2004. 51(2): p. 428-33.

Freed D E, Scheven U M, Zielinski L I, Sen P N, Htirlimann M D. Steady-state free precession experiments and exact treatment of diffusion in a uniform gradient. J. Chem. Phys. 115, 4249 (2001).

Friedrich K M, Mamisch T C, Plank C, Langs G, Marlovits S, Salomonowitz E, Trattnig S, Welsch G. Diffusion-weighted imaging for the follow-up of patients after matrix-associated autologous chondrocyte transplantation. Eur J Radiol 2010; 73(3):622-628.

Friedrich K M, Reiter G, Kaiser B, Mayerhofer M, Deimling M, Jellus V, Horger W, Trattnig S, Schweitzer M, Salomonowitz E. High-resolution cartilage imaging of the knee at 3 T: Basic evaluation of modern isotropic 3D MR-sequences. Eur J. Radiol. 2010 Feb. 5.

Kaiser R, Bartholdi E, Ernst R R. Diffusion and field-gradient effects in NMR Fourier spectroscopy. J Chem Phys 1974; 60:2966-2979.

Koh D M, Takahara T, Imai Y, Collins D J. Practical aspects of assessing tumors using clinical diffusion-weighted imaging in the body. Magn Reson Med Sci. 2007; 6(4):211-24.

Kwee T C, Takahara T, Ochiai R, Nievelstein R A, Luijten P R. Diffusion-weighted whole-body imaging with background body signal suppression (DWIBS): features and potential applications in oncology. Eur Radiol. 2008 September; 18(9):1937-52.

LeBihan D. Intravoxel incoherent motion imaging using steady-state free precession. Magn Reson Med 1988; 7:346-351.

Mamisch T C, Menzel M I, Welsch G H, Bittersohl B, Salomonowitz E, Szomolanyi P, Kordelle J, Marlovits S, Trattnig S. Steady-state diffusion imaging for MR in-vivo evaluation of reparative cartilage after matrix-associated autologous chondrocyte transplantation at 3 tesla—preliminary results. Eur J Radiol 2008; 65(1):72-79

McNab J A, Jbabdi S, Deoni S C, Douaud G, Behrens T E, Miller K L. High resolution diffusion-weighted imaging in fixed human brain using diffusion-weighted steady state free precession. Neuroimage. 2009 Jul. 1; 46(3):775-85.

Merboldt K D, Bruhn H, Frahm J, Gyngell M L, Hanicke W, Deimling M. MRI of "diffusion" in the human brain: New results using a modified CE-FAST sequence. Magn Reson Med 1989; 9:423-429.

Miller K L, Hargreaves B A, Gold G E, Pauly J M. Steady-state diffusion-weighted imaging of in vivo knee cartilage. Magnetic Resonance in Medicine 2004; 51: 394-398.

Patz S, Hawkes R C. The application of steady-state free precession to the study of very slow fluid flow. Magn Reson Med 1986; 3:140-145.

Schaefer P W, Grant P E, Gonzalez R G. Diffusion-weighted MR imaging of the brain. Radiology. 2000 November; 217(2):331-45

Welsch G H, Trattnig S, Domayer S, Marlovits S, White L M, Mamisch T C. Multimodal approach in the use of clinical scoring, morphological MRI and biochemical T2-mapping and diffusion-weighted imaging in their ability to assess differences between cartilage repair tissue after microfracture therapy and matrix-associated autologous chondrocyte transplantation: a pilot study. Osteoarthritis Cartilage 2009; 17(9):1219-1227.

Wu E, Buxton R. Effect of diffusion on the steady-state magnetization with pulsed field gradients. J Magn Reson 1990; 90:243-253.

What we claim is:

1. A method for diffusion-weighted MR imaging (DWI), comprising:
    performing a first double echo SSFP (DESS) scan of a sample, wherein a first set of SSFP-FID ($S_1^+$) and SSFP-Echo ($S_1^-$) image data of said sample is acquired from at least one first $S^+$ signal and at least one first $S^-$ signal and wherein said first set of image data has a gradient dephasing moment of $|G\tau_1|$,
    performing a second double echo SSFP (DESS) scan of said sample, wherein a second set of SSFP-FID ($S_2^+$) and SSFP-Echo ($S_2^-$) image data of said sample is acquired from at least one second $S^+$ signal and at least one second $S^-$ signal and wherein said second set of image data has a gradient dephasing moment of $|G\tau_2|$, wherein $|G\tau_1| \neq |G\tau_2|$,
    wherein at least said second set of image data is diffusion-sensitized via an unipolar diffusion sensitizing gradient pulse placed between said at least one second $S^+$ signal and at least one second $S^-$ signal,
    combining the first set of image data with the second set of image data to obtain a diffusion-weighted MR image which is insensitive to longitudinal and/or transverse relaxation times ($T_1$ and/or $T_2$).

2. The method of claim 1, wherein said first set of image data is diffusion-sensitized via an unipolar diffusion sensitizing gradient pulse placed between said at least one first $S^+$ signal and at least one first $S^-$ signal.

3. The method of claim 1, wherein $|G\tau_1|=0$.

4. The method of claim 1, wherein $|G\tau_2|>|G\tau_1|$.

5. The method of claim 1, wherein $G\tau_1$ and/or $G\tau_2$ are positive, zero or negative.

6. The method of claim 1, wherein said diffusion-weighted MR image is only sensitive to imaging data parameters.

7. The method of claim 6, wherein the imaging data parameters are the gradient dephasing moment $G\tau$, flip angle $\alpha$ and/or repetition time TR.

8. The method of claim 7, wherein said diffusion-weighted MR image is insensitive to $T_1$ and $T_2$ at flip angle ($\alpha$) for the first and/or second DESS scan below 30°, more preferably 20° degrees.

9. The method of claim 1, wherein a flip angle $\alpha$ of the first and/or second DESS scan is less than 50 degrees, preferably less than 40 degrees, less than 30 degrees, less than 20 or less than 15 degrees.

10. The method of claim 1, wherein the combined acquisition time for the first and second scan is less than 10 minutes, preferably less than 9, 8, 7, 6, 5 minutes.

11. The method of claim 1, wherein the sample comprises cartilage, spinal cord, muscle tissue, liver tissue, brain tissue or nerve tissue.

12. The method of claim 1, wherein said second set of image data is diffusion-sensitized via a singular unipolar diffusion sensitizing gradient pulse between each of the at least one second $S^+$ signal and at least one second $S^-$ signal during a double echo SSPF (DESS) scan of a sample.

13. The method of claim 1, wherein a repetition time (TR) of the first and/or second double echo scan is
   less than the transverse relaxation time ($T_2$) of the sample, or
   less than 200 ms, less than 150 ms, less than 100 ms, less than 90, 80, 70, 60, 50, 40, 30, 20 ms, preferably between 5 and 50 ms, even more preferably between 10 and 40, 10 and 30 or 10 and 20 ms.

14. The method of claim 1, wherein the dephasing moment is between 80 (mT/m)ms to 150 (mT/m)ms, preferably between 90 (mT/m) ms to 110 (mT/m) ms, more preferably about 100 (mT/m) ms, having an amplitude of between 20 mT/m and 30 mT/m, preferably about 25 mT/m.

15. The method of claim 1, wherein the signal attenuation of said first and second scan of the $S^+$ signal and the $S^-$ signal from diffusion is determined according to the following formula:

$$\Delta s := 1 - \frac{s^-}{s^+} = 1 - \frac{S_2^- \cdot S_1^+}{S_1^- \cdot S_2^+} = 1 - \frac{r_{1,2}}{r_{1,1}}$$

wherein
$r_{1,i} := r_1(G\tau_i)$,
$s^+ := S_2^+/S_1^+$, and
$s^- := S_2^-/S_1^-$.

16. The method of claim 1, wherein a molecular diffusion constant (D) is calculated from said diffusion weighted image comprising
   parameterizing $\Delta s$ within an interval of D,
   wherein $\Delta s = f(D, G\tau_{1,2}, TR, \alpha)$
   wherein $G\tau_{1,2}$, TR and $\alpha$ are constants for said first and second scan so that $\Delta s$ is a parameter of the diffusion constant D only, so that $\Delta s = f_{G\tau_{1,2}TR,\alpha}(D)$,
   wherein the diffusion constant D is calculated from inverting said parameterization:
   $D = f_{G\tau_{1,2}TR,\alpha}^{-1}(\Delta s)$.

17. The method of claim 16, wherein said interval of D is between 0 and 3 $\mu m^2$/ms.

18. The method of claim 17 further comprising quantitatively mapping the diffusion constant for said sample to obtain a quantitative diffusion map of said sample.

* * * * *